United States Patent [19]

Trushell

[11] 4,079,290
[45] Mar. 14, 1978

[54] GAS PANEL VOLTAGE REGULATOR

[75] Inventor: James Bryce Trushell, Saugerties, N.Y.

[73] Assignee: International Business Machines Corporation, Armonk, N.Y.

[21] Appl. No.: 690,755

[22] Filed: May 27, 1976

[51] Int. Cl.$^2$ .................. H05B 41/00; H05B 41/30
[52] U.S. Cl. .................. 315/169 R; 315/169 TV
[58] Field of Search .................. 315/169 TV, 169 R

[56] References Cited
U.S. PATENT DOCUMENTS 4,017,762  4/1977  Criscimagna et al. .......... 315/169 TV Primary Examiner—Maynard R. Wilbur
Assistant Examiner—Richard E. Berger
Attorney, Agent, or Firm—Joseph J. Connerton

[57] ABSTRACT

To compensate for the relatively wide variation in the electrical operating parameters of a gaseous discharge device resulting from varied physical characteristics, the amplitude of the signal used to sustain a discharge is determined, generated and controlled as a function of the physical characteristics of the panel. In operation, a plurality of sample cells are used for control purposes, and the sustain signal applied to the sample cells is incremented from zero during each sustain cycle until the sample cells are discharged, to determine the minimum sustain signal $V_S$ min. required to sustain the discharge. An offset circuit is used to increase the sustain signal by a predetermined amount above the $V_S$ min. level for panel operation, and a voltage regulator is connected in a closed loop arrangement with the sustain generator to automatically adjust the sustain signal to compensate for variation in the physical parameters of the device due to aging.

10 Claims, 2 Drawing Figures

GAS PANEL VOLTAGE REGULATOR

CROSS REFERENCE TO RELATED APPLICATIONS

Application Ser. No. 372,384 "Method and Apparatus for Gas Display Panel" filed by T. N. Criscimagna et al June 21, 1973.

Application Ser. No. 405,205 "Gas Panel Fabrication" filed by Peter H. Haberland et al Oct. 10, 1973, now U.S. Pat. No. 3,837,724.

BACKGROUND OF THE INVENTION

One of the critical parameters in the operation of a gaseous discharge device such as a display panel is the operating margin of the device which is defined as the range between the maximum sustain voltage $V_S$ max. and the minimum sustain voltage $V_S$ min. However, the fabrication process for gas panels is relatively complex and variable whereby the operating voltages required for individual panels may vary quite substantially, such that it is essential to determine and regulate the amplitude of the sustain signal on a panel-by-panel basis. Even by selecting a voltage level at some point within the normal operating range of the panel, the margin of the panel would be severely restricted if the panel was operating toward either end of the operating range rather than at an intermediate point therein. It is therefore essential that a means be provided for obtaining the appropriate sustain level on a panel basis to utilize the full operating margin for each panel. Additionally, provision must be made to compensate for variation in sustain signal levels resulting from aging, temperature variation or other operational characteristic variations.

SUMMARY OF THE INVENTION

One method of providing stable operating voltages for gaseous discharge devices is a voltage regulator to dynamically regulate the sustain signal and compensate for differences between the electrical operating parameters of discharge display panels. However, this requires that the initial operating level be defined. From an economic standpoint, it is also desirable to use relatively high tolerance components and thereby provide a lower cost driving system. The present invention uses a dynamic voltage regulator which samples the signal on an area of the panel and adjusts and maintains the sustain voltage to provide a constant avalanche or controlled discharge across the sample cells. To initiate operation, a small increment of voltage is added during each sustain cycle to the sustain reference starting from zero, and the sustain reference is continuously modified to a signal equal in amplitude to the previous reference plus the increment. If the sample cells are initially in a non-fired condition, the reference signal must be raised to the level sufficient to discharge the sample cells, a higher level than sustain. When the sample cells are discharged, a current flow is detected and the reference voltage is then decremented until the minimum sustain level $V_S$ min. is reached. However, since $V_S$ min. is not an effective operating level, an offset sustain signal above $V_S$ min. but within the operating range of the panel is added. Another aspect to the invention related to a circuit arrangement to prevent the erase signal during a non-selective panel erase from being applied to the sample cells, since a higher amplitude write signal would be required to refire the cells following each panel erase. The preferred embodiment of the invention utilizes a signal-ended drive system for the sample cells, , i.e., one axis maintained at a reference level and a full sustain applied to the other, but the invention is equally applicable to a double-ended sustain system since the effective sustain in the algebraic sum of the voltages across a cell.

Accordingly, a primary object of the present invention is to provide a sustain voltage regulator means for a gaseous discharge display device.

Another object of the present invention is to provide a self-sdjusting voltage regulator for a gaseous discharge display device to vary the electrical parameters of the control signals to conform to the physical characteristics of the specific gas panel.

The foregoing and other objects, features and advantages of the invention will be apparent from the following more particular description of a preferred embodiment of the invention, as illustrated in the accompanying drawings.

DESCRIPTION OF A PREFERRED EMBODIMENT

Figure 1:
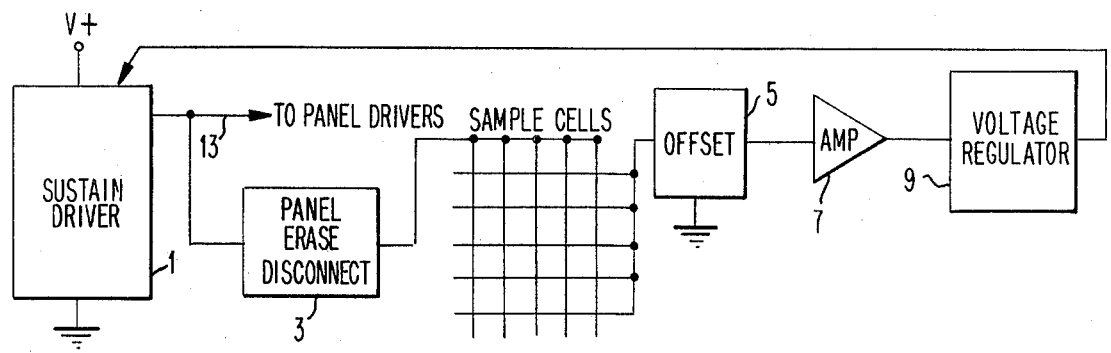
FIG. 1 is a block diagram of the system of the present invention.

Referring now to the drawings and more particularly to FIG. 1 thereof, the system concept of the present invention is illustrated in block form. Sustain or background driver 1 is a signal generator in which an increment of signal is added to a reference signal each sustain cycle to generate a reference voltage which is applied to the sample cells. Sample cells 31 are a series of adjacent cells corresponding to the normal display cells which may be positioned either within or without the viewing area of the panel and are used for determining the minimum sustain signal for the associated gaseous display device and also function as power on indicators. The sample cells 31 may be initially turned on or discharged by raising the sustain signal in successive increments to a signal level sufficient to ionize the gas in the cell. Once the sample cells have been discharged, the reference signal is then decremented during each successive sustain cycle until the minimum sustain level $V_S$ min. for the sample cells is reached. Alternatively, the sample cells could be initially discharged by application of an external write signal such as generated by the aforementioned application Ser. No. 372,384. Panel erase disconnect 3, more fully described hereinafter, prevents erasure of the sample cells 31 by the panel erase signal. Since the $V_S$ min. level does not provide a stable operating point for a gaseous discharge device, an offset circuit 5 is used to provide an operating level which is offset from the $V_S$ min. level by an amount sufficient to reach the midpoint of the operating margin. In the preferred embodiment, an offset value of 10 volts is used.

The signal from the offset circuit 5 is amplified by voltage amplifier 7 during each ignition or ionization time, up to twice per sustain cycle. The output from the amplifier 7 in turn is applied to voltage regulator 9, the output of which is connected through a loop closed arrangement as shown in FIG. 1 to control or modify the reference signal level from the background driver 1 such that the reference signal is dynamically adjusted for the specific discharge device. The voltage regulator circuit 9 does not operate until the sample cells have been discharged.

Figure 2:
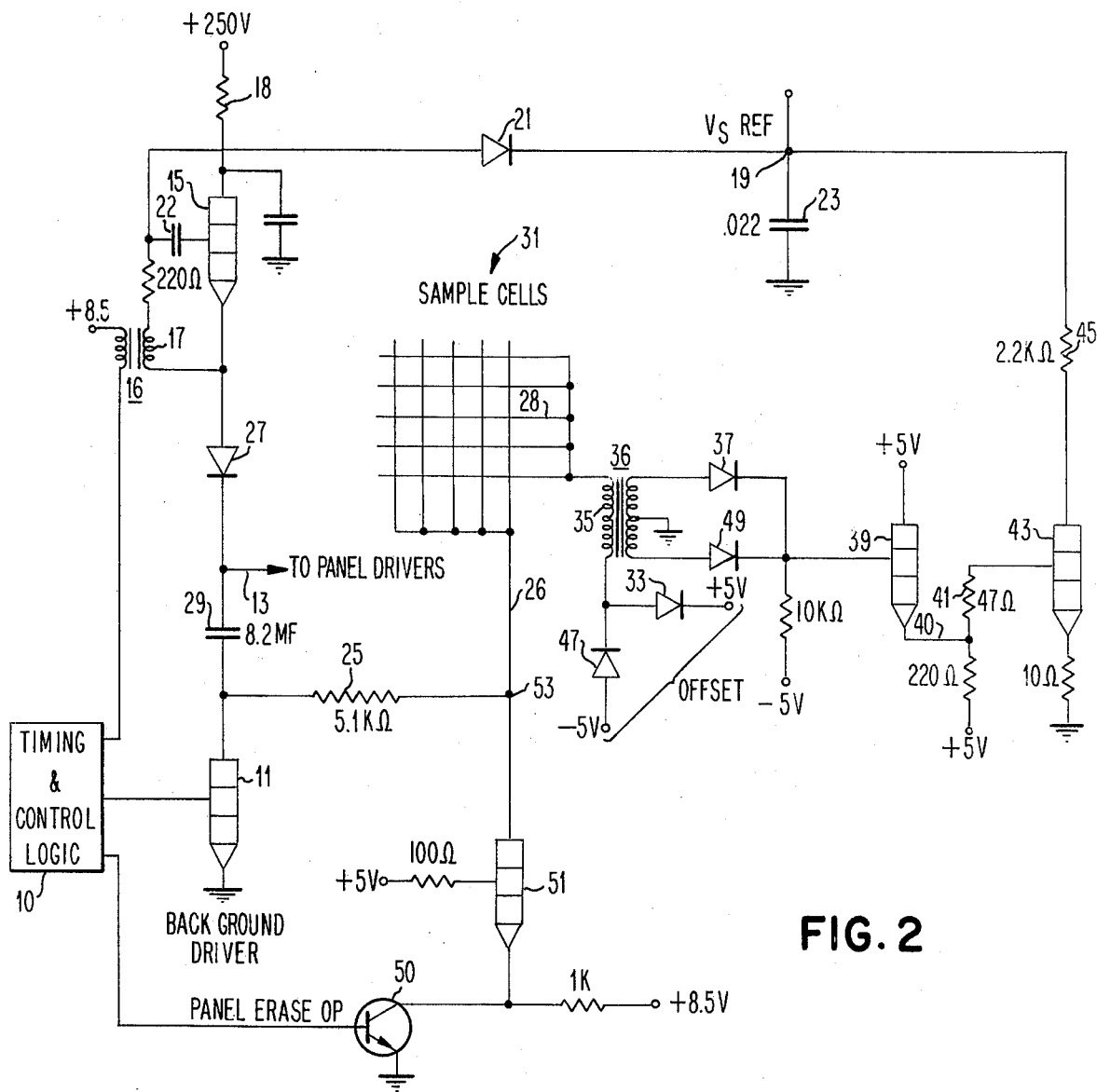
FIG. 2 is a schematic diagram of the invention illustrated in block form in FIG. 1.

Referring now to FIG. 2, there is illustrated in schematic form the signal control and regulator circuit illustrated in block form in FIG. 1. The sustain driver 1 used for generating the reference voltage includes transistor switch 11 which, when turned on by a control signal from timing and control logic 10, pulls the level of bus 13 connected to the panel drivers toward ground, and the sustain cycle is completed by turning transistor switch 15 on from a control signal from timing and control logic 10. The control signal used to turn on transistor switch 15 provides a dual function, in that the signal when applied through transformer 16 also generates the voltage increment which is added to the reference during each sustain signal iteration. Transistor 15 is turned on by the current flow through transformer secondary winding 17, and the emitter and base of transistor 15 start to rise toward the +250 volt level to which the collector 15 is connected through resistor 18 until they reach the $V_S$ reference level shown at terminal 19. Diode 21 draws current from the base of transistor 15 through capacitor 22, thereby functioning as an emitter follower to charge capacitor 23. The incremental changes to the reference signal are provided by transformer winding 17 which, as previously described, is adapted to generate a voltage of the specified incremental value which, in the preferred embodiment herein described, is 4 volts. When the $V_S$ minimum value is reached after discharge of the sample cells as previously described, current flows from the emitter of transistor 15 through diode 27, capacitor 29, resistor 25 and line 26 to one of the conductor sets or drive lines associated with sample cells 31.

As previously indicated, a single-ended drive is utilized in the preferred embodiment whereby a ground reference level is applied to one of the coordinate conductors, and a full sustain signal applied to the other conductor rather than having half sustan signals being applied to the horizontal and vertical conductors. The horizontal conductors 28 of sample cells 31 are connected to the primary winding 35 of transformer 36, and current flows from the +5 volt source through diode 33 and the primary winding 35 of transformer 36. In the secondary winding of transformer 36 during half of the sustain sequence, current flows through diode 37 to emitter-follower 39, where it is amplified and the output signal on conductor 40 applied through resistor 41 to the base of amplifier 43. The amplified signal at the collector of amplifier 43 causes current to be drawn through resistor 45 to thereby lower the voltage on capacitor 23. Thereafter this signal amplitude is maintained for the remaining portion of the sustain cycle.

The power on indicators or sample cells 31, as previously indicated, once discharged, operate at about the $V_S$ min. level On the next sustain cycle alteration, current flows from the sample cells through primary winding 35 of transformer 36 and diode 47 to the associated −5 volt source, producing a current flow from the secondary of transformer 36 through diode 49 to the same path described above, i.e., through emitter-follower 39, amplifier 43, resistor 45 and capacitor 23 to ground. Thus the pair of diodes 33 and 47 provide an offset of 10 volts to the $V_S$ min. signal used to turn on the sample cells 31, although the 10 volt offset in this case is a design criteria of the specific preferred embodiment rather than a positive offset appropriate to any specific panel.

In gas panel operation, an erase operation can be either selective or non-selective, and in the instant invention the design criteria of the preferred embodiment utilizes a non-selective or total panel erase. However, when the panel is erased, it is preferable that the erase not be extended to the sample cells, thereby eliminating the problem of turning on the cells after each erase operation. Accordingly, this problem is solved in the instant invention by a circuit arrangement which blocks the erase waveform from the sample cells in the following manner. Assume that the erase signal is a series of narrow pulses of sustain amplitude which are applied from sustain driver 1. When the erase signal is generated, a control signal designated panel erase operation is applied to the base of transistor 50 to turn transistor 51 on, and the current at collector junction 53 is applied through transistor 51 rather than to the sample cells 31. The erase signals which are applied via bus 13 to the drivers and panel are not significantly affected by this operation.

Utilizing a single-sided driving arrangement in the instant invention, a sustain signal of approximately 170± volts is applied to one of the axes of the sample cells 31, while the other axis is maintained at ground level although relatively wide variations may occur from panel-to-panel so that the reference sustain signal may vary as much as ±30 volts. However, the window or operating range of $V_S$ max. − $V_S$ min. is relatively constant.

While the invention has been particularly shown and described with reference to the preferred embodiment thereof, it will be understood by those skilled in the art that other changes in form and detail may be made therein without departing from the spirit and scope of the invention.

What is claimed is:

1. Apparatus for determining, generating and maintaining appropriate signal levels for operation of a gaseous discharge device comprising in combination
   a gaseous discharge cell,
   means for generating a reference signal,
   means for incrementing said reference signal at predetermined prescribed intervals,
   means for applying said reference signal to said discharge cell until said cell is discharged, the discharge of said cell to designate one of the operational limits of signals required to operate said gaseous discharge device.

2. Apparatus of the type claimed in claim 1 wherein said gaseous discharge cell is a sample cell designed for parameter testing.

3. Apparatus of the type claimed in clam 2 wherein said appropriate signal levels for operation of a gaseous discharge device relate to the sustain signal required to sustain a discharge.

4. Apparatus of the type claimed in claim 3 wherein said apparatus further comprises means to maintain the level of said sustain signal at a predetermined magnitude with respect to the signal amplitude used to discharge said sample cell.

5. Apparatus of the type claimed in claim 4 including means for controlling the operating range of said discharge device as a function of the signal amplitude to discharge said sample cell.

6. Apparatus for determining, generating and regulating the electrical parameters of a gaseous discharge device sustain generator comprising in combination
   a sustain driver, means for incrementing said sustain driver during a sequence of sustain signals, a plurality of sample cells in said discharge device, means for applying said incremented sustain signal to said sample cells until discharge of said cells, means for modifying the amplitude of the signal required to effect said discharge to define one of the operating parameters of said device, and means for maintaining said amplitude of said sustain signal as a function of the aging characteristics of said discharge device whereby the level of said sustain signal is automatically adjusted to compensate for variations in the physical parameters of said gaseous discharge device.

7. Apparatus of the type claimed in claim 6 wherein said means for maintaining said sustain signal amplitude includes a voltage regulator.

8. Apparatus of the type claimed in claim 6 wherein the means for modifying the amplitude of the signal required to effect said discharge comprises an offset circuit to add a signal of predetermined magnitude to said discharge effecting signal.

9. Apparatus of the type claimed in claim 6 further including means to erase said gaseous discharge device.

10. Apparatus of the type claimed in claim 9 wherein said apparatus include means to prevent said sample cells from being erased during erasure of said gaseous discharge device.

* * * * *